(12) United States Patent
De Graff et al.

(10) Patent No.: US 7,855,449 B2
(45) Date of Patent: Dec. 21, 2010

(54) COOLING DEVICE FOR A LIGHT-EMITTING SEMICONDUCTOR DEVICE AND A METHOD OF MANUFACTURING SUCH A COOLING DEVICE

(75) Inventors: Jan De Graff, Eindhoven (NL); Celine Catherine Sarah Nicole, Eindhoven (NL); Marcus Antonius Verschuuren, Eindhoven (NL); Hans Van Sprang, Eindhoven (NL); Theo Arnold Kop, Amsterdam (NL); Johan Marra, Eindhoven (NL); Ronald Martin Wolf, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 506 days.

(21) Appl. No.: 11/912,751

(22) PCT Filed: Apr. 19, 2006

(86) PCT No.: PCT/IB2006/051206

§ 371 (c)(1),
(2), (4) Date: Oct. 26, 2007

(87) PCT Pub. No.: WO2006/114726

PCT Pub. Date: Nov. 2, 2006

(65) Prior Publication Data

US 2008/0191236 A1    Aug. 14, 2008

(30) Foreign Application Priority Data

Apr. 27, 2005    (EP)    .................................. 05103467

(51) Int. Cl.
*H01L 23/34* (2006.01)
*H01L 23/10* (2006.01)

(52) U.S. Cl. ........................ 257/714; 257/707; 257/713; 257/98; 257/432; 257/433; 257/E23.113

(58) Field of Classification Search ................. 257/707, 257/713, 714, 81, 98, 432, 433, E23.113
See application file for complete search history.

(56) References Cited

U.S. PATENT DOCUMENTS

| 4,806,295 | A |   | 2/1989 | Trickett |
|---|---|---|---|---|
| 5,309,457 | A |   | 5/1994 | Minch |
| 5,386,143 | A |   | 1/1995 | Fitch |
| 6,045,240 | A | * | 4/2000 | Hochstein .................. 362/294 |
| 6,228,744 | B1 |   | 5/2001 | Levine |

(Continued)

FOREIGN PATENT DOCUMENTS

EP    2004296133    10/2004

(Continued)

*Primary Examiner*—Nitin Parekh

(57) ABSTRACT

A cooling device for cooling a light-emitting semiconductor device, such as a LED device (20), comprises a ceramic plate (15) having coolant-conveying channels (12) incorporated therein. The ceramic plate (15) is adapted for forming an integral part of the optical system of the light-emitting semiconductor device (20) and to cool a light-emitting portion (26) of the light-emitting semiconductor device (20). A method of forming a cooling device comprises the steps of forming a charge of ceramic particles, embossing the charge with a stamp to form coolant-conveying channels in the charge, hardening the charge, and providing a cover on top of the channels to seal them.

5 Claims, 4 Drawing Sheets

U.S. PATENT DOCUMENTS

| | | | |
|---|---|---|---|
| 6,614,103 B1* | 9/2003 | Durocher et al. | 257/678 |
| 7,204,615 B2* | 4/2007 | Arik et al. | 362/294 |
| 7,314,291 B2* | 1/2008 | Tain et al. | 362/294 |
| 7,391,153 B2* | 6/2008 | Suehiro et al. | 313/512 |
| 2004/0027067 A1 | 2/2004 | Song et al. | |
| 2004/0104672 A1* | 6/2004 | Shiang et al. | 313/506 |
| 2004/0120162 A1 | 6/2004 | Tsimerman et al. | |
| 2005/0152146 A1* | 7/2005 | Owen et al. | 362/294 |
| 2005/0253252 A1* | 11/2005 | Owen et al. | 257/714 |

FOREIGN PATENT DOCUMENTS

WO     03096387     11/2003

* cited by examiner

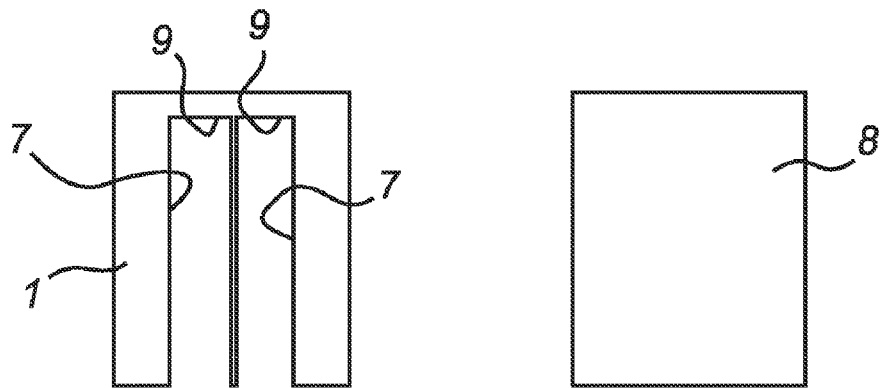
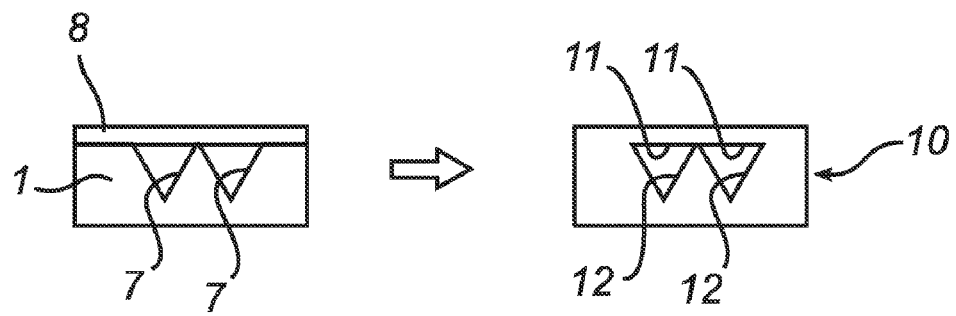
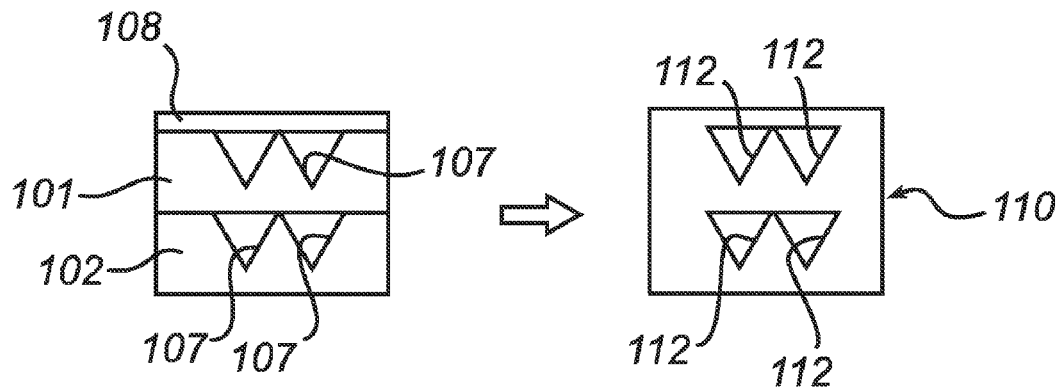

COOLING DEVICE FOR A LIGHT-EMITTING SEMICONDUCTOR DEVICE AND A METHOD OF MANUFACTURING SUCH A COOLING DEVICE

FIELD OF THE INVENTION

The present invention relates to a cooling device for cooling a light-emitting semiconductor device.

The present invention further relates to a method of forming a device for cooling a light-emitting semiconductor device.

BACKGROUND OF THE INVENTION

The use of LED's (Light Emitting Diodes) for purposes of solid state lighting, and in particular illumination lighting, is gaining more and more interest. Applications where LED's could be used as a source of illumination lighting, and not just as an indicator lamp, include room lighting, and in particular shopping area lighting, road lighting and automotive lighting, and in particular in automotive headlight applications. Common for all these new applications is that a LED, or often an array of LED's provided on a chip, is operated at a high power to provide the desired light output. The high power also results in heat build up in the LED chip. Such heat build up decreases the efficiency in converting the electric power to light, i.e. decreases the lm/W value, and may also cause the destruction of the LED chip due to irreversible thermal damage. Some newer types of LED devices that are useful for this type of application include hybrid phosphor converted modules and colour mixing RG(A)B modules. Heat build up in the LED device will also lead to heat build up in the luminescent materials of e.g. hybrid phosphor converted modules. The efficiency of the phosphor materials drop as the temperature rises and thus the light output will be lower than desired. WO 03/096387 describes a high intensity light source comprising a micro array of LED's placed on a substrate. In one embodiment a light bar is provided in which modules comprising arrays of LED devices formed on conductive substrates are mounted. The light bar is provided with a fluid circulation channel that is supplied with a coolant. The coolant is circulated between upper and lower metal plates to cool those parts of the light bar housing that requires cooling.

A problem with the lighting arrangement of WO 03/096387 is that it is quite complicated and requires quite much space. This makes it expensive and less useful for applications where space is limited.

SUMMARY OF THE INVENTION

An object of the present invention is to provide a cooling device for cooling light-emitting semiconductor devices, the cooling device providing for a small space requirement and efficient cooling.

This object is achieved by a cooling device for cooling a light-emitting semiconductor device, the cooling device comprising a ceramic plate having coolant-conveying channels incorporated therein, the ceramic plate being adapted for forming an integral part of the optical system of the light-emitting semiconductor device.

An advantage of this cooling device is that it is adapted to be located at the actual location of heat generation and thus provides for a local cooling and avoidance of local hot spots, which may lead to thermal damage inside the light-emitting semiconductor device. Ceramic materials are robust to heat and are suitable for forming thin plates with channels incorporated therein. A particular advantage is that ceramic materials exist which have suitable properties, as regards for instance transparency and refractive index, for having, in addition to cooling, an optical activity within the light-emitting semiconductor device.

An advantage of the measure according to claim 2 is that heat pipes provide a very efficient transport of heat from a hot spot to a heat sink without requiring any pump or similar device. Thus a ceramic plate with channels working according to the heat pipe principle requires little space and needs no additional mechanical parts. Such channels are thus particularly preferred for a ceramic plate that is to be incorporated in a light-emitting semiconductor device, where the demands are stringent for small space requirement, robust and simple design and long service life.

An advantage of the measure according to claim 3 is that the ceramic plate does not absorb the light emitted but allows the light to, at least partly, pass through. Thus the cooling device of the invention does not substantially decrease the amount of light emitted.

An advantage of the measure according to claim 4 is that it provides an optimum cooling of the luminescent material, and thus a high efficacy of this material, since the luminescent material is cooled directly by the channels in the ceramic plate. For instance luminescent phosphor particles included in the ceramic plate will be cooled very efficiently and thus the phosphor efficacy will be high. This is particularly advantageous in that it makes it possible to manufacture power phosphor converted LED devices with high phosphor efficacy.

An advantage of the measure according to claim 5 is that the cooling device may be placed very close to, or even in direct contact with, the light-emitting portion of the light-emitting semiconductor device. Thus the cooling device is located at the actual source of heat generation and may directly remove the heat from the light-emitting portion, thus increasing its light-emitting efficiency and its service life. A further advantage is that the ceramic plate may actually provide light out-coupling from the light-emitting semiconductor device and thereby increase the amount of out-coupled light.

An advantage of the measure according to claim 6 is that a good thermal and optical contact between the light-emitting portion and the cooling device is obtained.

An advantage of the measure according to claim 7 is that the cooling device provides efficient cooling of the light-emitting portion without being located in the way of the emitted light. This provides a larger choice of possible ceramic materials. Further, efficient cooling of both the light-emitting portion itself and a slug to which it is mounted is provided.

An advantage of the measure according to claim 8 is that the amount of out-coupled light is enhanced by the cooling device serving the dual purpose of being cooler and reflector.

Another object of the invention is to provide an efficient method of manufacturing cooling devices for light-emitting semiconductor devices and in particular cooling devices that has a suitable size for being integrated with the light-emitting semiconductor device.

This object is achieved by a method of forming a device for cooling a light-emitting semiconductor device, the method comprising the steps of forming a charge of ceramic particles, embossing the charge with a stamp, said stamp comprising a pattern, to form coolant-conveying channels in the charge, hardening the charge, and providing a cover on top of the channels to seal them and to form a ceramic plate comprising coolant-conveying channels, the plate being adapted for forming an integrated element of the light-emitting semiconductor device.

An advantage of this method is that embossing with a stamp is an efficient way of producing small-scale structures, also with a complicated geometrical design, with a high accuracy and good reproducibility. In particular as regards ceramic particles forming a sinter-active charge this method is suitable for forming structures before sintering the ceramic particles to form a ceramic plate.

An advantage of the measure according to claim 10 is that it provides for a simple way of sealing liquid in channels of the cooling device to provide it with heat pipe properties.

These and other aspects of the invention will be apparent from and elucidated with reference to the embodiments described hereinafter.

BRIEF DESCRIPTION OF THE DRAWINGS

The invention will now be described in more detail with reference to the appended drawings in which:

FIG. 2*a* is a schematic plan view and shows the charge seen from above.

FIG. 2*b* is a schematic side view and shows a third step in the above-mentioned method.

FIG. 2*c* is a schematic side view and shows an alternative third step in the above-mentioned method.

DESCRIPTION OF PREFERRED EMBODIMENTS

Figure 1A:
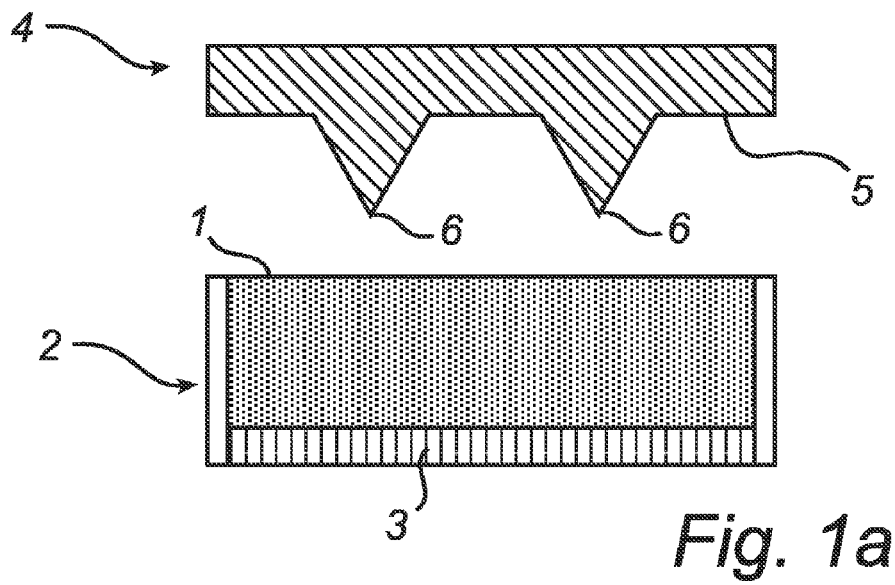
FIG. 1*a* is a schematic cross-section and shows a first step in a method of manufacturing a ceramic plate having coolant-conveying channels incorporated therein.

FIG. 1*a* shows schematically a first step of forming a ceramic plate having coolant-conveying channels incorporated therein. A charge 1 of a suspension of ceramic (sub) micron powder is formed in a mould 2. The bottom of the mould 2 is a porous plate 3, such as a porous ceramic plate. An elastomeric stamp 4 is provided with a structured pattern at its surface 5. The structured pattern has the shape of a number of elongated ridges 6. The stamp 4 is manufactured from a template, which has been structured by photolithography, which is a technology that is per se well known.

The ceramic material making up the ceramic micron powder is preferably a material that is at least partially translucent in its sintered state. Examples of such ceramic materials include poly crystalline alumina ($Al_2O_3$), aluminium nitride (AlN), yttrium aluminium garnet ($Y_3Al_5O_{12}$, also called YAG) and luminescent ceramic materials like cerium doped yttrium aluminium garnet ($Y_3Al_5O_{12}$:Ce). These ceramic materials are translucent to transparent materials that additionally have a high thermal conductivity, which provides good heat transfer properties. Further these materials have an index of refraction that is close to or higher than that of sapphire, which facilitates light out coupling. In a preferred embodiment the ceramic material contains a luminescent material. For instance the ceramic material could form a matrix in which luminescent phosphor particles are embedded. Another alternative is to use a ceramic material, which in itself is luminescent.

Figure 1B:
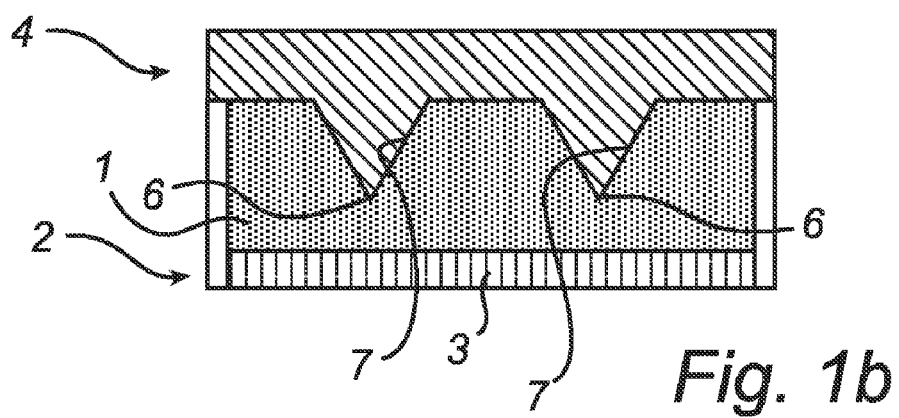
FIG. 1*b* is a schematic cross-section and shows a second step of the above-mentioned method.

FIG. 1*b* illustrates schematically a second step of forming said ceramic plate. In this second step the stamp 4 is forced against the charge 1 in such manner that the ridges 6 of the structured pattern are embossed into the charge 1. The ridges 6 of the pattern will thus form elongated trenches 7 in the charge 1. While still having the pattern pressed into the charge 1 the liquid is sucked into the porous plate 3 via capillary forces so as to remove the liquid from the suspension of the charge 1. As the liquid leaves the charge 1 the remaining portion of the charge 1, i.e. the ceramic particles, will form a structured compact of powder particles.

The method of removing liquid from a charge comprising a suspension in order to form a compact is generally referred to as slip casting and is known per se.

It will be appreciated that several other methods can be used to harden the charge. For instance the suspension of ceramic particles could be provided with a component that hardens under thermal- and/or UV-treatment. Increasing the temperature in the charge and/or illuminating the mould by UV-light may make the charge hard so that the stamp can be removed. The added component could be a photoactive organic or thermally active organic material that is burned out after removing the stamp.

Figure 1C:
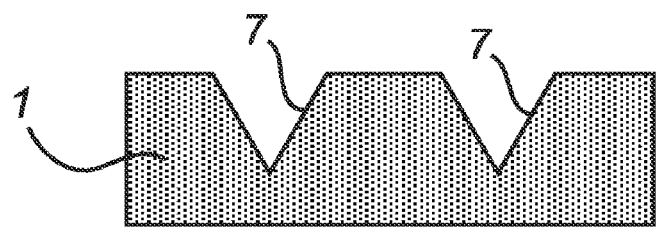
FIG. 1*c* is a schematic cross-section and shows a charge of ceramic particles that has been structured and compacted.

FIG. 1*c* shows the charge 1 with trenches 7 after the stamp 4 has been removed.

FIG. 2*a* is a top view and shows the charge 1 with the trenches 7 next to a cover plate 8. As shown in FIG. 2*a* the trenches 7 do not extend over the entire upper surface of the charge 1. Thus a rear wall 9 is formed in each trench 7. The charge 1 and the cover plate 8 are, as shown in FIG. 2*a*, in a so-called green state, by which is meant that both the charge 1 and the cover plate 8 are in a sinter active state.

Although the trenches 7 shown in FIG. 2*a* are simple straight trenches 7 it will be appreciated that much more complicated trench structures could be formed in a charge. Thus trenches forming any type of grid pattern and with almost any type of micro structures could be formed in order to fit the requirements for transporting heat from a hot spot to a heat sink, as will be described below.

FIG. 2*b* illustrates a third step in the method of making the ceramic plate. The top plate 8 is put on top of the charge 1 to cover the trenches 7. The top plate 8 and the charge 1 are then co-sintered. The sintering may optionally include hot isostatic pressing. The co-sintering produces a block 10 in which the trenches 7 are covered from the top by means of roofs 11 formed by the top plate 8. Thus channels 12 are formed in the block 10.

FIG. 2*c* illustrates an alternative embodiment. In this embodiment a first compacted charge 101, having trenches 107, is put on top of a second compacted charge 102 having similar trenches 107. A top plate 108 is put on top of the first charge 101 to cover the trenches 107 of that charge 101. The lower surface of the charge 101 itself covers the trenches 107 of the second charge 102. Both charges 101, 102 and the top plate 108 are in a sinter active state (green state). The charges 101, 102 and the top plate 108 are exposed to a co-sintering, and optionally hot isostatic pressing, forming a block 110 in which the trenches are covered and which thus has channels 112 arranged in a three-dimensional channel structure. It is clear that the alternative third step illustrated in FIG. 2c could be employed for forming blocks with any number of channel layers stacked on top of each other.

Figure 2D:
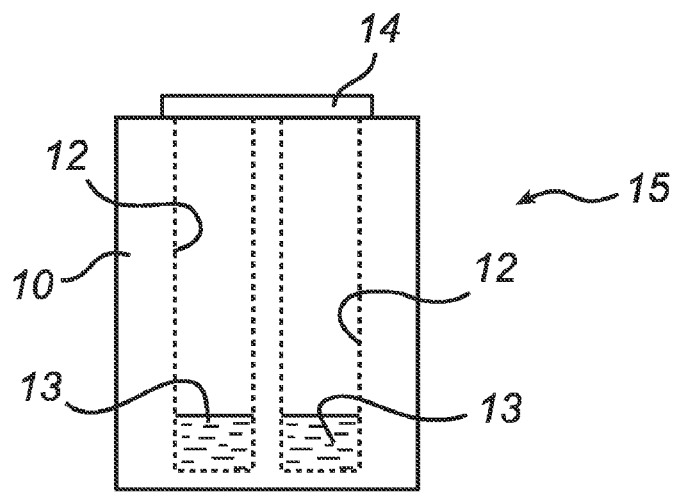
FIG. 2*d* is schematic plan view and shows a final step in the above-mentioned method.

FIG. 2d illustrates a final step in forming a ceramic plate having coolant conveying channels incorporated therein. First an amount of liquid 13 is added to each channel 12. The channels 12 are then evacuated, i.e. any air is removed. A seal 14 is then applied to the open ends of the channels 12. The seal 14 could be of different materials that provide gas tight seals, such as glasses, and is applied in such manner that the liquid 13 is not vaporized in the process. One possible solution is to apply melted glass onto the openings of the channels 12. This might include the provision of cooling of that portion of the block 10 in which the liquid 13 is located to avoid vaporisation of liquid in the sealing process. After sealing the channels 12 a ceramic plate 15 having coolant conveying channels 12 incorporated therein has been formed and is ready for to be applied to a light-emitting semiconductor device, as will be described below.

By proper choice of the dimensions of the channels 12 the ceramic plate 15 will function as a cooler according to heat pipe principles. The principle of a heat pipe is well known and is described in, among other documents, "Experimental investigations of micro heat pipes fabricated in silicon wafers", Peterson G. P. et al, Journal of Heat Transfer, vol 115. pp 751-756, 1993. In short a heat pipe is a sealed elongated channel of small cross sectional dimension. A liquid is applied inside the heat pipe that is otherwise evacuated. A first end of the elongated heat pipe is used as the heat-receiving end at which heat is absorbed and evaporates the liquid. A second end of the elongated heat pipe is used a condenser and is connected to a heat sink. At the second end the vapour is condensed so as to recuperate the liquid. The rate of vapour travel from the first end to the second end is governed by the difference in vapour pressure between the two ends. With proper design of the size and shape of the channels the liquid formed at the second end of the heat pipe is by capillary force transported to the first end where it is again evaporated. Typically the heat pipes are provided with angular sections or capillary microstructures to enhance the capillary force. The liquid thus works as an efficient circulating heat transporting media. Thus the heat pipe principle provides for efficient cooling without the need for any pump or similar device since the cooling liquid is transported by means of capillary force only. Suitable cooling liquids include methanol and water. The cross sectional dimensions and the detailed design of the heat pipes is optimised for the ceramic material in question to provide a suitable capillary pressure. Typically a heat pipe has a hydraulic diameter of 10 to 500 micron and a length of 10 to 70 mm. Small sized heat pipes are insensitive to gravitational forces, which provides extra freedom in the orientation of the heat pipes.

Figure 3:
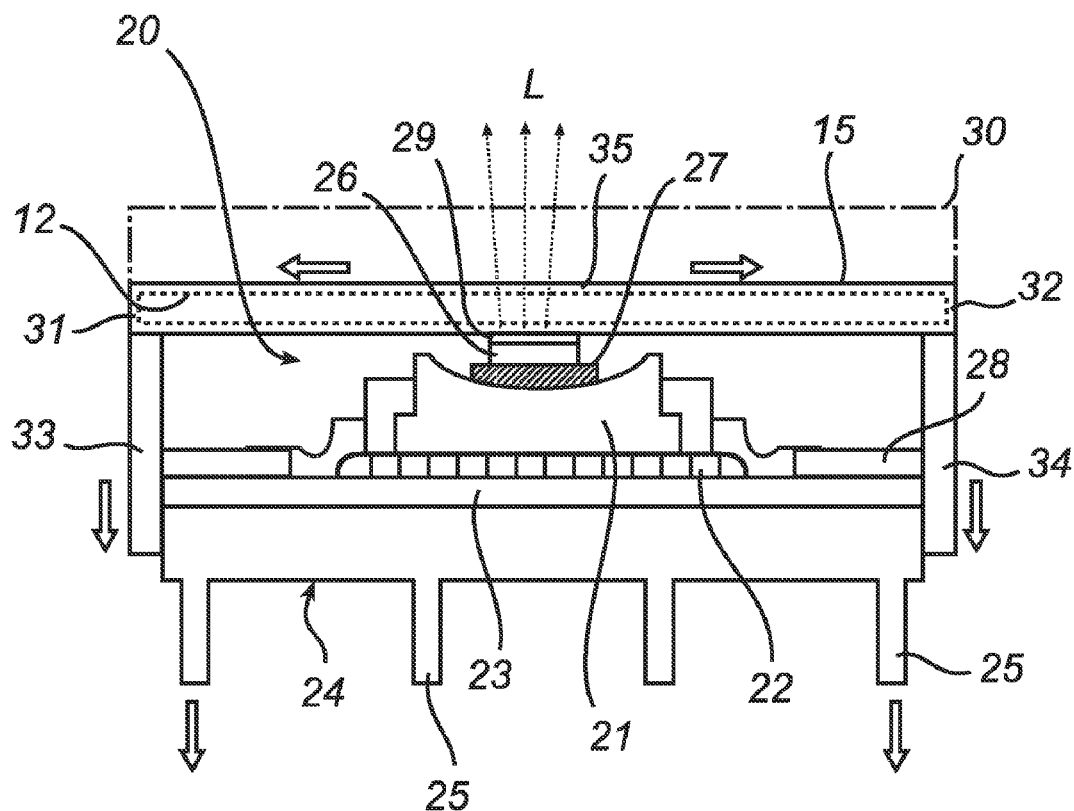
FIG. 3 is a schematic cross section and shows a ceramic plate according to a first embodiment of the invention attached to the front side of a light-emitting portion of a LED device.

FIG. 3 illustrates the ceramic plate 15 integrated in a high power semiconductor device in the form of a high power LED (Light Emitting Diode) device 20. The LED device 20 could, for example, form part of a row or an array of LED's forming a headlight for a car or forming an illumination-lighting source for a shopping area. The LED device 20 comprises a slug 21 that by means of an adhesive 22 is fixed to a heat spreading board 23, made of aluminium. The board 23 is placed on top of a cooler 24 having cooling flanges 25 adapted for emitting heat to ambient air. A light-emitting portion in the form of a die 26 is glued to the slug 21 by means of a die-attach epoxy 27. The slug 21 is provided with a reflective coating adjacent to the die 26 and thus serves to reflect any light that is emitted from the die 26 in the direction of the slug 21. A printed circuit board 28 supplies the LED device 20 with power. The ceramic plate 15, which is translucent and preferably comprises a luminescent material, such as luminescent phosphor particles, is glued to the die 26 by means of optical glue 29 to obtain optical and thermal contact with the die 26 of the LED device 20. The glue 29 could, for example, be an optical type glue, which is preferably mixed with nano-size powder. The nano-size powder is preferably made of a material having a wide band gap, a high thermal conductivity and a high refractive index to have a matching index of refraction with both the die 26 and the ceramic plate 15. Examples of suitable materials for forming such a nano-size powder include nano-sized AlN and $TiO_2$.

In operation light L is emitted from the die 26. The light L is transmitted through the optical glue 29 and through the translucent ceramic plate 15. On top of the ceramic plate 15 an additional layer 30, or several additional layers, may be placed. This layer, or layers, may comprise further ceramic plates, a light diffuser, light outcoupling structures, light collimating structures, luminescent phosphor particles etc. The slug 21, the die 26, the die attach epoxy 27, the optical glue 29, the ceramic plate 15 and the optional layers 30 form together the optical system of the high power LED device 20. The light emission results in the generation of heat that is transferred to the ceramic plate 15. The heat makes the liquid in the channel 12 evaporate (it will be appreciated that the ceramic plate 15 comprises a multitude of channels, although only one channel 12, seen from the side, is shown in FIG. 3). Thus vapour is produced in the channel 12 adjacent to the die 26. On each side 31, 32, and at a distance from the die 26, the ceramic plate 15 is in thermal contact with conducting columns 33, 34. The conducting columns 33, 34 are in contact with the cooler 24 and are made of a material with a high thermal conductivity, such as a metal or a poly crystalline alumina. Thus vapour will be condensed at the sides 31, 32 since the columns 33, 34 are indirectly cooled by the cooler 24. According to the principles of heat pipe the condensed liquid will be transported, by means of capillary force, from the ends 31, 32 and to that area 35 of the channel 12 that is adjacent to the die 26, where the liquid is again evaporated. It will be appreciated that the liquid in the channels 12 is preferably a liquid, such as water or a lower alcohol, which is transparent both in the liquid and in the vapour state. The block arrows indicate how heat is transported from the die 26, and the other components of the LED device 20 as well, from the area 35 to the ends 31, 32 of the channel 12 of the ceramic plate 15. From the ends 31, 32 the heat is transported further into the columns 33, 34 and to the cooler 24. The cooler 24 emits the heat to the ambient air via the flanges 25. Thus a very efficient cooling of the LED device 20, and in particular of the die 26, is obtained which means that the LED device 20 may be operated at a very high power without the risk of thermal destruction of the die 26 or of other components of the LED device 20. In case the ceramic plate 15 comprises a luminescent material, such as luminescent phosphor particles, or is being formed in its entirety from a luminescent ceramic material, the luminescent material is efficiently cooled by the cooling channels 12 formed in the ceramic plate 15, thereby providing a high efficacy of the luminescent material.

Further the ceramic plate 15 may also have a light outcoupling function. To this end channels 12 could be made with other cross-sections than the shape of a pyramid turned upside down, as shown in FIG. 2c. For instance the channels could be given the shape of a cone or a lens. The arrangement of the channels could also be designed such as to provide optimum light out-coupling.

Figure 4:
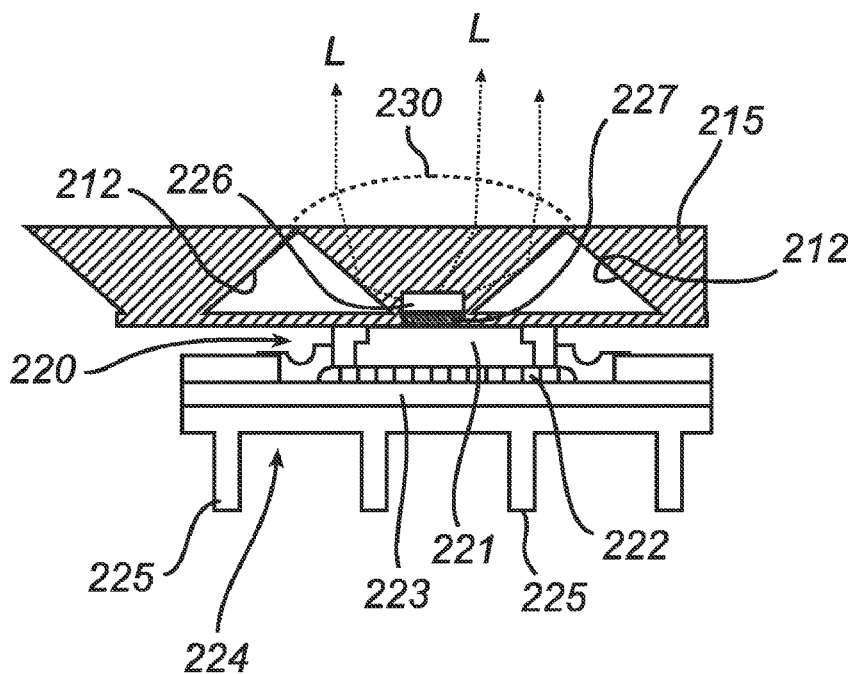
FIG. 4 is a schematic cross section and shows a ceramic plate according to a second embodiment of the invention attached to the front side of a light-emitting portion of a LED device.

FIG. 4 illustrates a second embodiment of the invention in the form of a ceramic plate 215 made of a translucent ceramic, such as poly crystalline alumina, YAG or AlN. Preferably the ceramic plate 215 comprises a luminescent material. The ceramic plate 215 has elongated channels 212, which are shown in a cross section in FIG. 4. The channels 212 extend in a direction perpendicular to the paper and are connected to heat sinks, not shown in FIG. 4. As shown in FIG. 4 a LED device 220 is partly located inside the actual ceramic plate 215. In the case shown in FIG. 4 a die 226 and a die-attachment glue 227 of the LED device 220 are entirely or almost entirely located inside the ceramic plate 215, while a slug 221, to which the die 226 is attached, is located outside the ceramic plate 215. The LED device 220 further comprises, similar to what is described with reference to FIG. 3, an adhesive 222, a heat spreading board 223, and a cooler 224 having cooling flanges 225.

The channels 212 have the cross-sectional shape of a pyramid. The base of the pyramid typically has a size of one to a few mm. It will be appreciated that the ceramic plate 215 can be made according to the principles of FIG. 1a-1c and FIG. 2a-2d and then just be turned around. Since the channel structure shown in FIG. 4 is comparably large it is, as one alternative, possible to form trenches that are to form the basis for the channels, by machining a sinter active compacted ceramic charge, instead of using a stamp. As described in FIG. 3 a suitable optical glue (not shown in FIG. 4) is used for obtaining proper optical and thermal contact between the die 226 and the ceramic plate 215. A collimating lens 230 may be provided on top of the ceramic plate 215.

The slug 221, the die 226, the die-attachment glue 227, the ceramic plate 215 and the lens 230 form together the optical system of the LED device 220. In operation light L is emitted from the die 226. As is shown in FIG. 4 some of the light is emitted directly through the ceramic plate 215 and the collimating lens 230. Some of the light is, however, reflected on the walls of the pyramid shaped channels 212 and is then out-coupled via the collimating lens 230. Thus the channels 212 in the ceramic plate 215 serve the purpose of improving the out-coupling of light from the LED device 220. In addition, and in accordance with similar principles as described with reference to FIG. 3, the channels serve to cool the LED device 220, and in particular the embedded die 226, according to the heat pipe principles.

The ceramic plate 215 shown in FIG. 4 thus serves the dual purpose of out-coupling light from the LED device 220, the increased out-coupling having as a positive side effect that the heat generated inside the LED device is decreased, and cooling the LED device 220, and the die 226, to provide efficient light emission and limited risk of thermal damages in high power LED applications.

Figure 5:
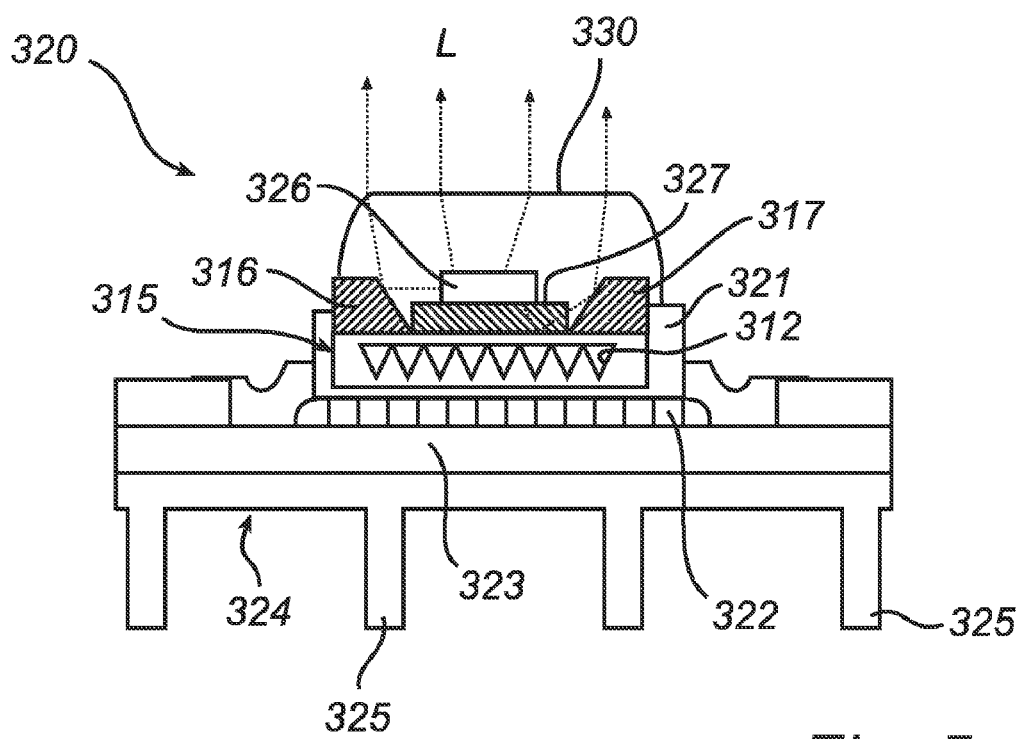
FIG. 5 is a schematic cross section and shows a ceramic plate according to a third embodiment of the invention attached to the back side of a light-emitting portion of a LED device.

FIG. 5 illustrates a third embodiment of the invention in the form of a ceramic plate 315. The ceramic plate 315 is provided with a number of elongated channels 312, shown in cross-section in FIG. 5, that are similar to the channels 12 illustrated in FIG. 2b. The ceramic plate 315 is integrated into a slug 321 of a LED device 320. A die 326 is attached to the ceramic plate 315 by means of a die-attachment glue 327. The LED device 320 further comprises, similar to what is described with reference to FIG. 3, an adhesive 322, a heat spreading board 323, and a cooler 324 having cooling flanges 325. The ceramic plate 315 is made of poly crystalline alumina that is mixed with particles of high index of refraction, such as $ZrO_2$. The particles of high index of refraction provide the ceramic plate 315 with diffuse reflective properties. As alternative coating its upper surface by a whitish ceramic coating could provide such properties. A further possibility is to manufacture the ceramic plate of a cermet, i.e. a composite of metal and ceramic, optionally coated with a reflective coating. The ceramic plate 315 is provided, on its upper surface, with ceramic wings 316 and 317, which could be made of poly crystalline alumina. The ceramic wings 316, 317 also have diffuse reflective properties, which could be provided by, for example, mixing with particles of high index of refraction, coating with a reflective coating or by giving the ceramic wings 316, 317 a controlled porosity.

In operation light L is emitted from the die 326. As is shown in FIG. 5 some of the light is emitted directly through a collimating lens 330. Some of the light is, however, reflected on the ceramic wings 316, 317 and/or on the ceramic plate 315 and is then out-coupled via the collimating lens 330. Thus the ceramic plate 315 with its wings 316, 317 serves the purpose of improving the out-coupling of light from the LED device 320. In addition, and in accordance with similar principles as described with reference to FIG. 3, the channels 312 serve to cool the LED device 320, and in particular the die 326, according to the heat pipe principles and to transport the heat to a heat sink, not shown in FIG. 5. Thus the slug 321, the die 326, the die-attachment glue 327, the ceramic plate 315 having wings 316, 317 and being integrated in the slug 321, and the lens 330 form together the optical system of the LED device 320, the ceramic plate 315 forming part of that optical system. The ceramic plate 315 shown in FIG. 5 thus serves the dual purpose of out-coupling light from the LED device 320 and cooling the LED device 320, and the die 326, to provide efficient light emission and limited risk of thermal damages in high power LED applications.

It will be appreciated that numerous variants of the above-described embodiments are possible within the scope of the appended patent claims.

For example it is possible to combine a ceramic plate placed in front of a die, as shown in FIG. 3 and FIG. 4, with a ceramic plate at the back of the die, as shown in FIG. 5, to provide intense cooling of both sides of the die.

Further it will be appreciated that channels could be provided in the ceramic plate in any suitable pattern to fit with design of the LED device, or the array of LED devices, to provide suitable heat transport from the LED device and to the heat sink. As indicated in FIG. 2c it is possible to use multiple layers of channels. It is also possible to design other shapes of the channels and to provide the channels with internal microstructures to enhance the capillary force.

Above it is described that the ceramic plate is adapted to form an integral part of the optical system of the light-emitting semiconductor device and to have optical properties, i.e. the ceramic plate is either transparent or provided with reflective properties. It will be appreciated that the ceramic plate could also form an integral part of the optical system without having, in itself, optical properties. For instance the ceramic plate could be embedded inside the slug to cool the light-emitting semiconductor device close the location where light is emitted, and heat is produced, the optical properties, i.e. reflection, residing in the slug inside which the ceramic plate is embedded. It will be appreciated, however, that it is preferred in many applications that the ceramic plate in addition to provide the cooling effect also has optical activity, e.g. works as a window, a lens or a mirror to help forwarding or directing emitted light in a desired direction.

With reference to FIGS. 3 and 4 it is described that a luminescent material is preferably incorporated in the ceramic plate 15, 215. This is often preferred in high power LED applications since the cooling of the luminescent material becomes very efficient due to the cooling channels 12, 212 inside the ceramic plate 15, 215. Another option is to locate a luminescent material on top of the ceramic plate. For instance luminescent phosphor particles may be attached to the upper surface of the ceramic plate (by "upper surface" is meant the upper surface of the ceramic plate as it is shown in FIG. 3 and FIG. 4). Also in such a case the cooling of the luminescent material would be effective. Still a further option is to include the luminescent material, such as luminescent phosphor particles, on the die, in which case the channels in the ceramic plate would also very effectively cool the luminescent material. Thus there are several options for where to place a luminescent material and to still obtain a very efficient cooling by means of the ceramic plate.

Above it is described how the channels in the ceramic plate perform cooling according to the heat pipe principles. It is of course also possible to use the ceramic plate according to the invention for cooling according to other principles. Larger sized channels could, for example, be provided with a circulating cooling liquid flow by means of a liquid pump.

To summarize a cooling device for cooling a light-emitting semiconductor device, such as a LED device 20, comprises a ceramic plate 15 having coolant-conveying channels 12 incorporated therein. The ceramic plate 15 is adapted for forming an integral part of the optical system of the light-emitting semiconductor device 20 and to cool a light-emitting portion 26 of the light-emitting semiconductor device 20.

A method of forming a cooling device comprises the steps of forming a charge 1 of ceramic particles, embossing the charge 1 with a stamp 4 to form coolant-conveying channels 12 in the charge 1, hardening the charge 1, and providing a cover 8 on top of the channels 12 to seal them.

The invention claimed is:

1. A cooling device for cooling a light-emitting semiconductor device, the cooling device comprising a ceramic plate having coolant conveying channels incorporated therein, the ceramic plate being adapted for forming an integral part of an optical system of the light-emitting semiconductor device, such that the ceramic plate is at least partially located at a front side of a light-emitting portion of the light-emitting semiconductor device in an optical and thermal contact with the light-emitting portion.

2. A cooling device according to claim 1, wherein the channels are heat pipe channels that contain, sealed in the channels, a liquid.

3. A cooling device according to any one of the preceding claims, wherein the ceramic plate comprises an at least partly translucent ceramic material.

4. A cooling device according to claim 3, wherein the ceramic plate comprises a luminescent material.

5. A cooling device according to claim 1, wherein the ceramic plate is adapted to be glued to the light-emitting portion.

* * * * *